United States Patent [19]
Banerjee et al.

[11] Patent Number: 5,958,077
[45] Date of Patent: *Sep. 28, 1999

[54] METHOD FOR TESTING ASYNCHRONOUS CIRCUITS

[75] Inventors: Savita Banerjee, Doylestown, Pa.; Srimat T. Chakradhar, North Brunswick; Rabindra K. Roy, Plainsboro, both of N.J.

[73] Assignee: NEC USA, Inc., Princeton, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/579,387

[22] Filed: Dec. 27, 1995

[51] Int. Cl.⁶ ........................................................ G06F 11/00
[52] U.S. Cl. ........................................ 714/738; 395/500.05
[58] Field of Search ............................. 371/27, 15.1, 22.1, 371/28, 61; 327/202; 307/272.2; 324/158 R; 714/738, 32, 33, 37, 38; 395/500.05

[56] References Cited

U.S. PATENT DOCUMENTS

| | | | |
|---|---|---|---|
| 4,870,345 | 9/1989 | Tomioka et al. | 371/22.3 |
| 5,083,049 | 1/1992 | Kagey | 307/480 |
| 5,097,468 | 3/1992 | Earlie | 371/15.1 |
| 5,291,495 | 3/1994 | Udell, Jr. | 371/22.3 |
| 5,406,216 | 4/1995 | Millman et al. | 327/202 |
| 5,412,663 | 5/1995 | Kromer et al. | 371/22.1 |
| 5,493,505 | 2/1996 | Banerjee et al. | 364/488 |
| 5,633,813 | 5/1997 | Srinivasan | 364/578 |

OTHER PUBLICATIONS

Jens Leenstra et al., "Using hierarchy in macro cell test assembly", European test conference, 1989 Procee., pp. 63–70; Mar. 1989.

Jens Leenstra et al., "On the design and test of asynchronous macros embedded in synchronous systems", International test conference, pp. 838–845, Mar. 1989.

A. Marshall, et al. "Designing an Asynchronous Communication Chip", IEEE Design & Test of Computers 11(2):8–21, Sep., 1994.

K. van Berkel, et al. "Asynchronous circuits for Low Power: A DCC Error Corrector", IEEE Design & Test of Computers, 11(2):22–32, Sep., 1994.

J. Tierno, et al. "100–MIPS GaAs Asynchronous Microprocessor", IEEE Design & Test of Computers, 11(2):43–49, Sep., 1994.

R. Marlett "An Effective Test Generation System for Sequential Circuits", Design Automation Conference, pp. 250–256, 1986.

(List continued on next page.)

*Primary Examiner*—Robert W. Beausoliel, Jr.
*Assistant Examiner*—Nadeem Iqbal
*Attorney, Agent, or Firm*—Jeffery J. Brosemer; Philip J. Feig; Andrew G. Isztwan

[57] ABSTRACT

A synchronous test model (STM) and corresponding method capture the essential behavior of an asynchronous circuit under test. During operation of the method, (1) An STM for the asynchronous circuit is constructed assuming either a user-specified cycle length or an estimated cycle length; (2) a target fault list is created containing only faults in the asynchronous circuit, (3) test patterns are generated from the STM using a synchronous test generator; (4) the test patterns are translated into test sequences for the asynchronous circuit; and (5) the translated patterns are validated by fault simulation on the asynchronous circuit. The STM offers numerous advantages over prior art methods namely, (1) synchronous, sequential test generation techniques can be used to generate tests for the model, (2) tests generated for the STM can always be translated into tests for the asynchronous circuit under test, and (3) these tests will not suffer from test invalidation due to unstable states, because the STM enforces a fundamental mode of operation during test generation. Experimental results on several benchmarks show that the STM method generates high fault coverage tests with no test invalidation.

4 Claims, 12 Drawing Sheets

OTHER PUBLICATIONS

A. Gosh et al. "Test Generation for Highly Sequential Circuits", International Conference on Computer-Aided Design, pp. 362–365, 1989.

T. Niermann, et al. "HITEC: A Test Generation Package for Sequential Circuits", Proc. European Design Automation Conference, pp. 214–218, 1991.

W.T. Cheng, et al. "Gentest: An Automatic Test Generation System for Sequential Circuits", Computer, 22:43–49, Apr., 1989.

P.A. Beerel, et al. "Semi–modularity Experiments for Sequential Circuits", $5^{th}$ International Symposium on Switching Circuit Theory and Logic Design, pp. 95–110, 1964.

M. Breuer, et al "Procedures for Eliminating Static and Dynamic Hazards in Test Generation", in IEEE Transactions on Computers, pp. 1069–1077, Oct., 1974.

S. Banerjee, et al. "Initialization Issues in the Synthesis of Asynchronous Circuits", International Conference on Computer Design, pp. 447–452, Oct., 1994.

S.T. Chakradhar, et al. "Synthesis of Initializable Asynchronous Circuits", Proceedings $7^{th}$ International conference on Computer Design, pp. 447–452, Oct., 1994.

L. Benini, et al. "Saving Power by Synthesizing Gated Clocks for Sequential Circuits", IEEE Design & Test of Computers, pp. 32–41, Winter, 1994.

F.J. Ferguson "Physical Design for Testability for Bridges in CMOS Circuits", IEEE VLSI Test Symposium pp. 290–295, 1993.

A.J. Martin "Testing Delay–Insensitive Circuits", Advanced Research in VLSI, pp. 118–132, 1991.

F.C. Hennie "Fault Detection Experiments for Sequential Circuits", $5^{th}$ International Symposium on Switching Circuit theory & Logic Design, pp. 95 –110, 1964.

A. Mukherjee "Introduction to nMOS and CMOS VLSI Systems Design", Prentice Hall, 1986, pp. 34–112.

M. Abramovici, et al. "Digital Systems Testing and Testable Design" Computer Science Press, 1990, pp. 305–339.

| Vectors | D_in | CLK_in | *pass* |
|---------|------|--------|--------|
| 1 | 1 | 0 | 0 |
| 2 | 1 | 1 | 0 |
| 3 | 1 | 0 | 0 |
| 4 | 1 | 1 | 1 |

Figure 6(a)

| Vector | D | CLK |
|--------|---|-----|
| 1 | 1 | 1 |

Figure 6(b)

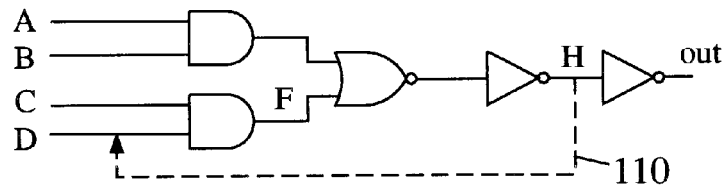
Figure 11(a)
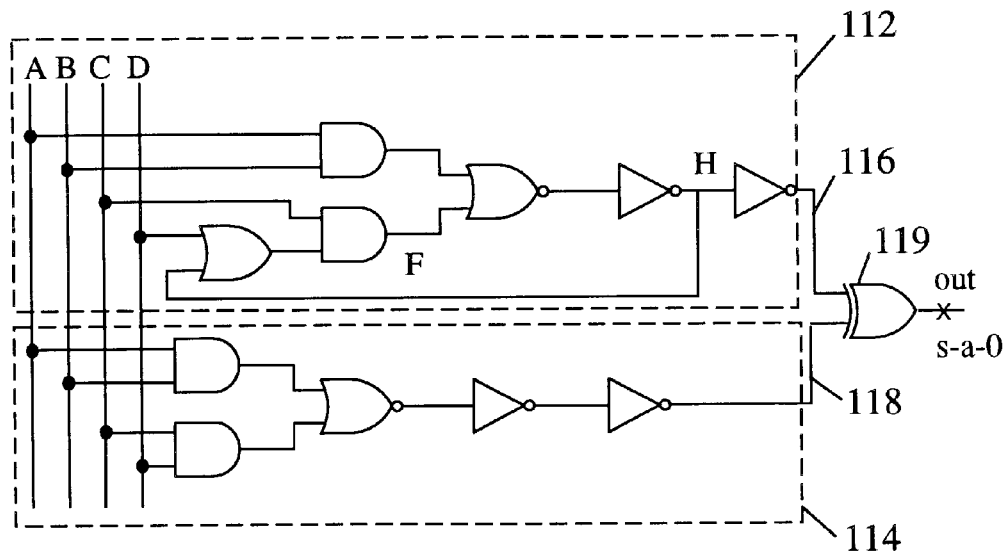
Figure 11 (b)
| Vectors | A | B | C | D |
|---------|---|---|---|---|
| 1 | 1 | 1 | 0 | 1 |
| 2 | 1 | 0 | 1 | 0 |
Figure 11(c)

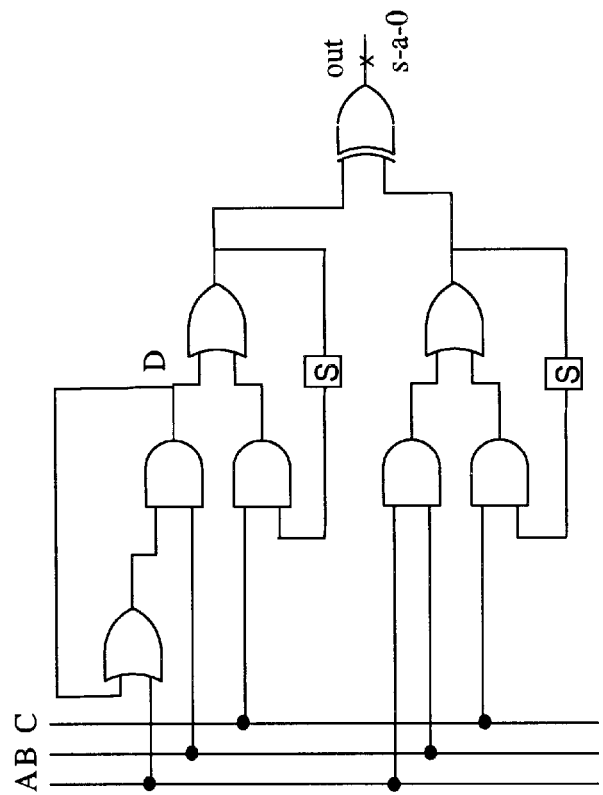
Figure 12(b)
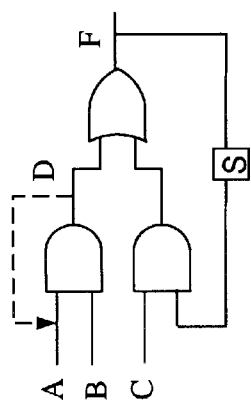
Figure 12(a)
| Vectors | A | B | C |
|---|---|---|---|
| 1 | 1 | 1 | 0 |
| 2 | 0 | 1 | 0 |
| 3 | 1 | 0 | 1 |
Figure 12(c)

METHOD FOR TESTING ASYNCHRONOUS CIRCUITS

TECHNICAL FIELD

This invention relates to a method for automatically testing electronic circuits and in particular to a method for the automatic testing of asynchronous circuits.

DESCRIPTION OF THE PRIOR ART

Asynchronous circuits are oftentimes used in situations where clock-related problems such as clock skew and worst-case execution time cannot be tolerated. Yet despite their reported high performance and low power consumption (See, e.g., A. Marshall, B. Coates and P. Siegel, "Designing an Asynchronous Communications Chip", *IEEE Design & Test of Computers*, 11 (2):8–21, September, 1994; K. vanBerkel, R. Burgess, J. Kessels, M. Roncken, F. Schalij and A. Peeters, "Asynchronous Circuits for Low Power: A DCC Error Corrector", *IEEE Design & Test of Computers*, 11 (2):22–32, September 1994; J. Tierno, A. Martin, D. Borkovic and T. Lee, "100-MIPS GaAs Asynchronous Microprocessor", *IEEE Design & Test of Computers*, 11 (2):43–49, September, 1994), asynchronous circuits are extremely difficult to test, thereby inhibiting their widespread adoption for industrial applications.

Most asynchronous circuits are delay-dependent. Correct operation of an asynchronous circuit therefore, depends upon relative delays of underlying logic. If an asynchronous circuit is not designed carefully, it may exhibit characteristics known as hazards and races, which in turn may lead to unpredictable behavior. Even when however, when an asynchronous circuit has an input applied to it, the circuit may cycle through several unstable states before finally settling in a stable state. This cycling occurs through combinational logic over multiple time frames and, as is often the case, asynchronous circuits never settle even when no input is applied, a condition known as oscillation.

Prior art methods for testing asynchronous circuits often lead to test invalidation, because prior art models used for automatic test generation (ATG) and fault simulation (FS) do not accurately model behavior of the of asynchronous circuits. The problems associated with ATG of asynchronous circuits are further compounded because ATG requires a search, often through a large search space, requiring back-traces and backtracks, whereas FS requires only a forward propagation. As a result, the prior art teaches the use of a simple and less accurate model for ATG, and a more accurate and complex model for FS. Consequently, an asynchronous circuit under test may exhibit a response during simulation which is different from that predicted by a test generator.

In sharp contrast, synchronous circuits are free from such testing problems because all states are stable and problems with timing seldom arise. Also, since all state changes in synchronous circuits occur synchronously with respect to a global clock, circuit behavior is more predictable and less sensitive to delays. By ensuring a proper clock-period, the problems associated with asynchronous circuits, i.e., hazards, races, and test invalidation, are eliminated. Consequently, several techniques for the automatic test generation of synchronous circuits have been described in the literature. (See, e.g., R. Marlett, "An Effective Test Generation System for Sequential Circuits", *Design Automation Conference*, pp. 250–256, 1986; A. Gosh, S. Devadas and A. Newton, "Test Generation for Highly Sequential Circuits", *International Conference on Computer-Aided Design*, pp. 362–365, 1989; T. Niermann and J. Patel, "HITEC: A Test Generation Package for Sequential Circuits", *Proc. European Design Automation Conference"*, pp. 214–218, 1991; W. T. Cheng and T. J. Chakraborty, "Gentest: An Automatic Test Generation System for Sequential Circuits", *Computer*, 22:43–49, April 1989.)

A majority of the prior art techniques for asynchronous circuit testing were developed prior to the widespread use of Very Large Scale Integration (VLSI), when small circuit sizes permitted manual test generation. Such prior art techniques incorporated functional methods, such as checking experiments which are described in an article by F. C. Hennie, entitled "Fault Detection Experiments for Sequential Circuits", in $5^{th}$ *International Symposium on Switching Circuit Theory and Logic Design*, pp. 95–110, 1964. Despite their contributions, these techniques are impractical for large circuits since they operate at a flow table level which grows exponentially with the number of signals involved, quickly making a test unwieldy.

More recently however, testing strategies and methods for asynchronous circuits at a synthesis level have been described. (See, e.g., P. A. Beerel and T. H. Y. Meng, "Semimodularity and Testability of Speed-Independent Circuits", *Integration, the VLSI Journal*, Vol. 13, pp. 301–322, 1992; and A. J. Martin, "Testing Delay-Insensitive Circuits", *Advanced Research in VLSI*, pp. 118–132, 1991). However, these strategies and methods are restricted to a small class of self-timed and speed-independent circuits and they assume that circuits are generated by means of a synthesis pipeline and that a behavioral specification is available. While this may be sufficient in some instances, one cannot generally assume that the same techniques will perform adequately for circuits at a structural level. Therefore, a test sequence obtained through the use of these methods still requires validation on a final, structural level implementation. Furthermore, a more serious infirmity with this method is that it requires the behavioral specification for the circuit. Such representations are difficult and oftentimes impossible to extract, particularly when the circuits are manually designed.

A constrained test generation technique was shown by M. Breuer and R. Harrison, in an article entitled "Procedures for Eliminating Static and Dynamic Hazards in Test Generation", in *IEEE Transactions on Computers*, pp. 1069–1077, October, 1974. There, the authors addressed the problem of asynchronous circuit test invalidation due to hazards by constraining inputs applied to various devices. As taught by this technique, any input combination that is likely to cause a hazard is disallowed.

Finally, the effect of unstable states on test invalidation was examined by M. Brueur in "The Effects of Races, Delays and Delay Faults on Test Generation" in *IEEE Transactions on Computers*, pp. 1078–1092, October 1974, in which a multiple timeframe expansion technique was suggested to incorporate a fundamental mode assumption during test generation.

Despite initial optimism and promise, however, these latter prior art techniques for testing asynchronous circuits suffer from several serious limitations. First, both techniques require the development of a program for asynchronous circuit test generation. Second, they can only be used for small circuit designs, since the evaluation of delays and unstable states during test generation is so computationally intensive, it is impractical for most designs.

Thus, the need remains in the art for a method which completely and efficiently tests asynchronous circuits.

SUMMARY OF THE INVENTION

The above problems are overcome and advance is made over the prior art in accordance with the principles of the present invention wherein a new synchronous test model (STM) that accurately models an asynchronous circuit under test is used to impose a fundamental mode of operation during a test generation. By forcing the circuit to operate in the fundamental mode, a new input cannot be applied to the circuit until it has stabilized. In this inventive manner, test generation is constrained without modifying a synchronous test algorithm.

Specifically, the present invention operates by 1) Constructing an STM for the asynchronous circuit assuming a user-specified cycle length time or an estimated time; 2) Creating a target fault list which contains only faults in the asynchronous circuit; 3) Generating test patterns on the STM using a known, synchronous test generator; 4) Translating these test patterns into sequences for the asynchronous circuit; and 5) Validating the translated patterns by fault simulation on the asynchronous circuit.

Further features and advantages of the present invention, as well as the structure and operation of various embodiments of the present invention are described in detail below with reference to the accompanying drawings.

BRIEF DESCRIPTION OF THE DRAWINGS

The teachings of the present invention can be readily understood by considering the following detailed description in conjunction with the accompanying drawings, in which:

FIG. 5b is a schematic of an STM corresponding to the asynchronous circuit of FIG. 5a;

FIG. 6a is a table showing a test sequence for the STM of FIG. 5b;

FIG. 6b is a table showing a translated test for the STM of FIG. 5b;

FIG. 10b is a schematic of a two-clock STM for the circuit of FIG. 10a;

FIG. 10c is a schematic of a single-clock STM for the circuit of FIG. 10a;

FIG. 11a is a schematic showing a feedback bridging fault in a combinational circuit;

FIG. 11b is a schematic of an ATG model for the circuit of FIG. 11a;

FIG. 11c is a table showing a translated test sequence for the ATG model of FIG. 11b;

FIG. 12a is schematic showing a feedback bridging fault in a synchronous sequential circuit;

FIG. 12b is a schematic of an ATG model for the circuit of FIG. 12a; and

FIG. 12c is a table showing a translated sequence for the ATG model of FIG. 12b.

DETAILED DESCRIPTION

A preferred embodiment of the invention will now be described while referring to the figures, several of which may be simultaneously referred to during the course of the following description.

Figure 1:
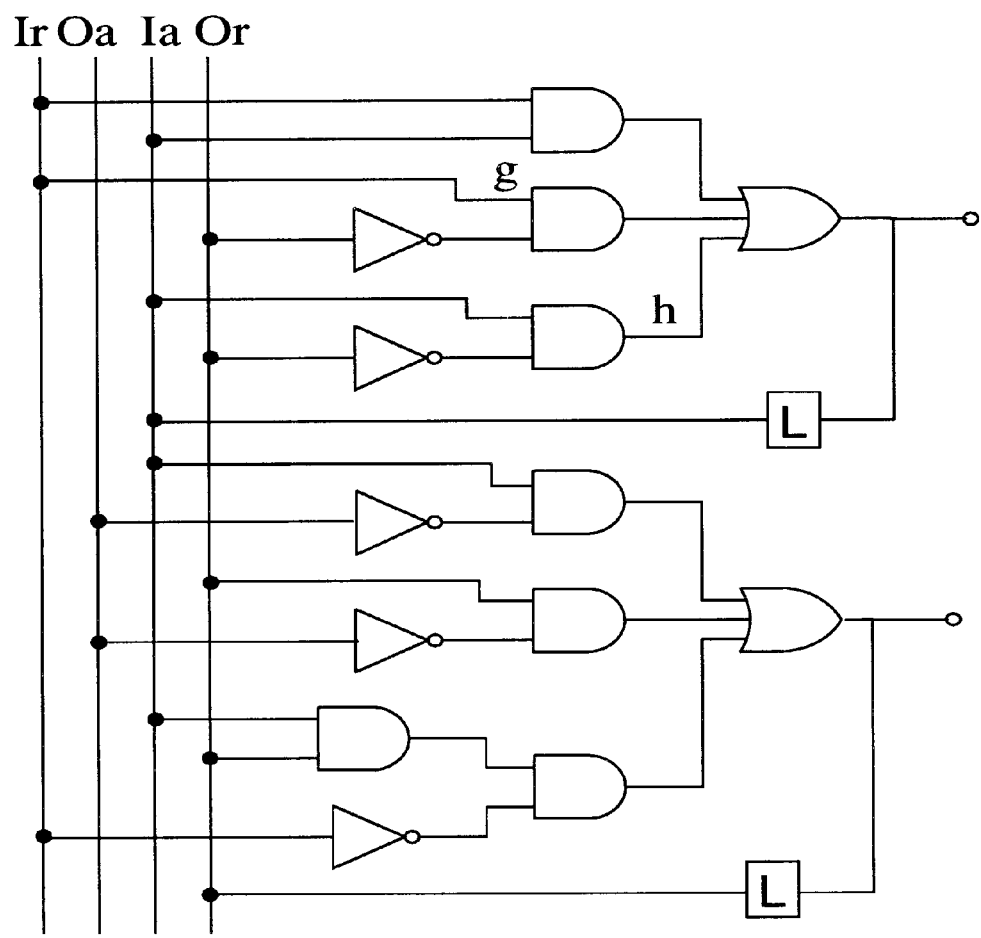
FIG. 1 is an electrical schematic of an exemplary asynchronous circuit.

With reference to FIG. 1, there is shown an asynchronous circuit, having blocks designated by the letter "L" representing asynchronous latches as feedback elements. For such a circuit, it is easy to verify that fault h s-a-0 requires a primary input assignment, $I_r=0$, $O_a=1$, and an internal state of $I_a=1$, $O_r=1$ for detection.

However, if one performed a zero-delay fault simulation on this circuit, it would be apparent that neither a good nor a faulty circuit would ever stabilize in this internal state. This is because the internal state is unstable and cannot be observed during testing. Therefore, if an effect of a fault can only be observed in a state that is unstable in both the good and faulty circuits, it is undetectable and no valid tests exist for this fault.

In other words, a fault in an asynchronous circuit is detectable by a test only if an effect of the fault can be observed in a stable state. If observation of the effect of the fault can only occur in a state that is unstable in both good and faulty circuits, then the fault is undetectable. Similarly, a test for a target fault is invalid if the test assumes observation of the effect of the fault in a state that is unstable in both good and faulty circuits.

Figure 2B:
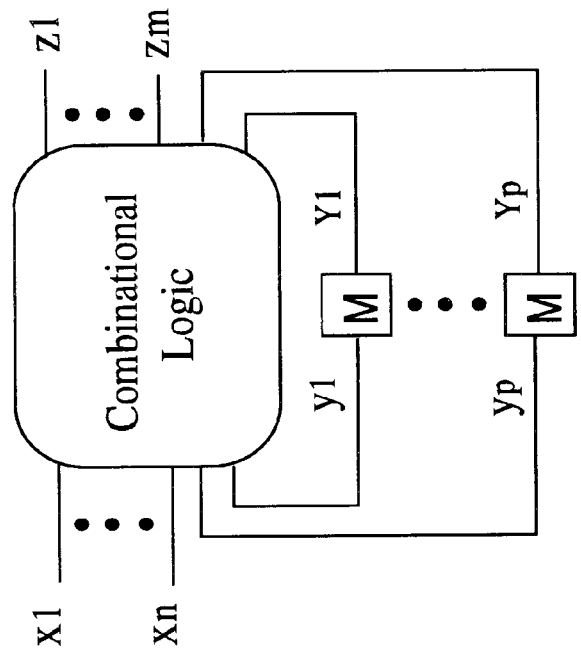
FIG. 2b is a block diagram of a second ad-hoc synchronous test model for an asynchronous circuit.
Figure 2A:
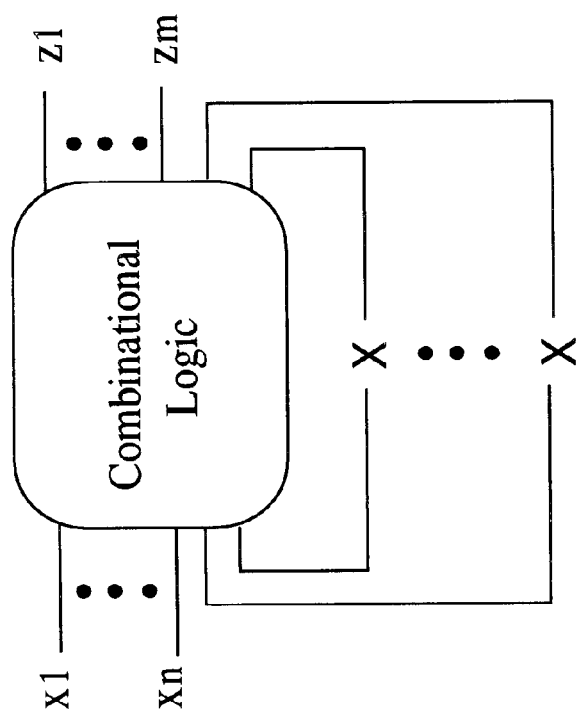
FIG. 2a is a block diagram of a first ad-hoc synchronous test model for an asynchronous circuit.

By way of example, consider the two simple synchronous models shown in FIGS. 2(a) and 2(b). With respect to the model shown in FIG. 2(a), all feedback loops are broken and state variables are not used for test generation. Such a requirement is enforced by maintaining an "X" or "don't care" value on all state variable lines during test generation. The model depicted in FIG. 2(a) only exercises primary input lines (PIs), primary output lines (POs), and any combinational part of the circuit directly accessible from the PIs and POs.

A second, less restrictive model is shown in FIG. 2(b). In this second model, all feedback elements are replaced with clocked storage elements or flip-flops (FFs), as indicated by boxes containing the letter M. Test patterns for these synchronous models can be generated using a conventional synchronous test generator. The generated patterns are then validated by performing a fault simulation on the asynchronous circuit.

If one considers fault g s-a-1 shown in FIG. 1 and applies it to these two models, one quickly sees that no test can be generated for this fault using the first model. This is because this fault requires a specific internal state for detection. Conversely, if one uses the second model, one sees that a possible test for this fault is $I_r=1$, $O_a=1$, $I_a=0$, and $O_r=1$. Nevertheless, a fault simulation reveals that this state is unstable. Therefore, the test is invalidated and the fault remains undetected.

These two ad-hoc models make several incorrect assumptions regarding asynchronous circuit behavior which affect the validity and the quality of the generated tests. In the first model where the feedback loops were broken, it was assumed that the state of the circuit need not be known for generating a test for a fault. This assumption eliminates test invalidation due to use of unstable states, however, no test will be found for many detectable faults, thereby resulting in a low fault coverage.

Those skilled in the art can understand that a basic difference between asynchronous and synchronous circuits is that in the former, time is a continuous entity, whereas in the latter time is discrete and a clock period is an indivisible unit of time. Consequently, synchronous circuits are designed such that the clock period is chosen to be longer than a critical path delay of combinational logic. As such, clocked flip-flops are put on a feedback path. Proper selection of clock period ensures that a delay of the feedback path is greater than a delay of a forward path through the combinational logic.

In the synchronous circuit, the clock allows a signal to pass through the flip-flop only once for each input pattern applied to the circuit. Conversely, in the asynchronous circuit, there is no clock to prevent signal flow through the feedback path which often contains asynchronous latches therefore, the signal flow through the feedback path can occur multiple times for a single change in input pattern. This phenomenon is known as cycling and for every such pass through the feedback path, the circuit passes through an unstable state. This cycling continues until the circuit settles in a stable state. Thus, state signals may have to go through the latches several times for a single change in the primary input lines.

As used herein, the cycle length of an asynchronous circuit is the maximum number of passes through the feedback path that is necessary for the circuit to stabilize for any given input signal change. This is equal to m+1, where m is the maximum number of unstable states between any two stable states of the asynchronous circuit.

The second model described previously fails to generate valid tests because it does not take into account the existence of unstable states and cycling, thereby resulting in test invalidation. In sharp contrast and quite unlike prior art methods and models, a model and method which is the subject of the present application, takes into account both cycling and unstable states and approximates continuous time by dividing time into very fine units.

By way of example, consider an asynchronous circuit where n is a maximum number of state transitions between any two stable states. Consequently, this requires that there are at most n−1 unstable states between any two stable states. If asynchronous latches on the feedback path are replaced by clocked flip-flops and a clock period is greater than or equal to a critical path delay of a forward path through the combinational logic, then each pass through the clocked feedback path will simulate a pass through the asynchronous latch.

With simultaneous reference to FIGS. 2a and 2b, in order to properly simulate cycling behavior, it is necessary to maintain input patterns on primary input lines, x1–xn for the duration of a cycle. Similarly, primary outputs z1–zm, should be observed only when the cycling is complete because the output lines may have unpredictable values during the cycling. This therefore, leads to a number of rules which must be followed for the proper modeling of an asynchronous circuit:

[1] A new input pattern should only be applied to a fault-free or a faulty circuit when the circuit has stabilized;

[2] The effect of a fault should only be observed when the fault-free or the faulty circuit have stabilized; and

[3] Upon application of a new input pattern, the circuit should be allowed to cycle through intermediate unstable states until a stable state is reached while the input pattern is held steady.

Figure 3:
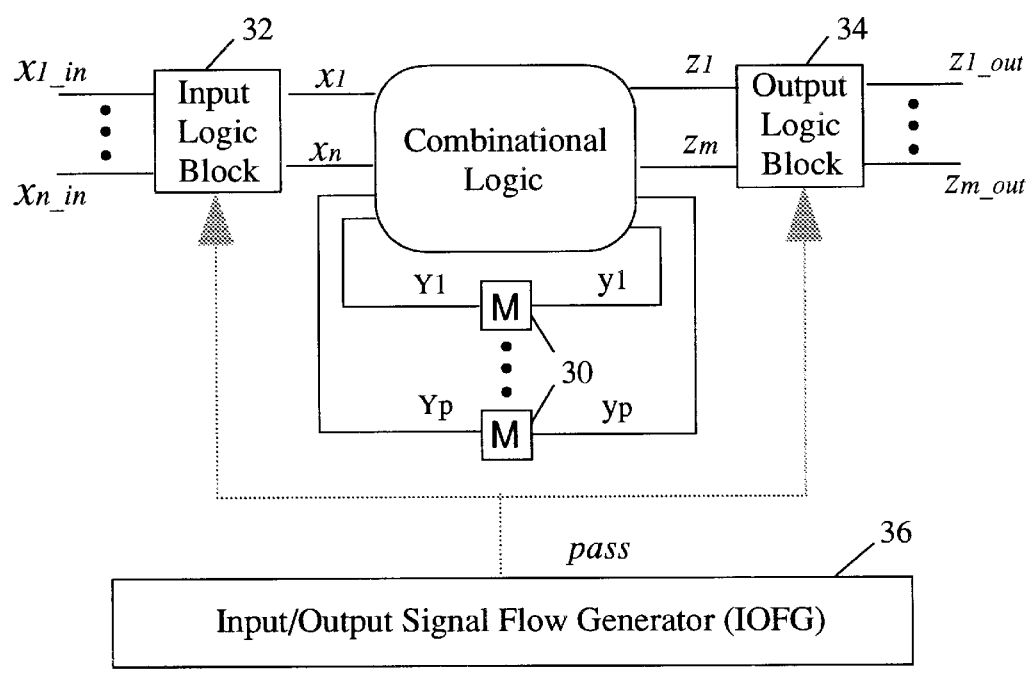
FIG. 3 is a block diagram of a general synchronous test model for synchronous circuits.

Turning our attention now to FIG. 3, there is shown a general schematic for a synchronous test model (STM) which is the subject of the present application. There, $x1\_in$–$xn\_in$ and $z1\_out$–$zm_{13}$ out denote a set of primary input lines and a set of primary output lines of the STM, respectively. In the STM shown in FIG. 3, asynchronous feedback elements are replaced with clocked storage devices, which are clocked at a SYN_PERIOD, which is equal to a critical path delay of any combinational logic in a forward path. In the Figure, blocks 30, are conveniently called "model flip-flops" because they exist only in a synchronous model of an asynchronous circuit.

The model shown in FIG. 3 introduces three additional blocks to the circuit, namely, an input logic block (ILB) 32, an output logic block (OLB) 34, and an input/output signal flow generator (IOFG) 36. It is important to note that these blocks appear only in the STM and are not part of a physical design.

The IOFG 36 generates signals to control a flow of new input patterns to the circuit and a flow of output signals from the circuit to an external environment. A new input pattern is applied to the circuit only when the signal pass is asserted by the IOFG 36, otherwise a previous input pattern is maintained at the inputs. Similarly, the output line is only observed when the signal pass is activated by IOFG 36. A proper design of IOFG 36 ensures that the STM will operate in a fundamental mode. Such design, however, requires a knowledge of both stable and unstable states of both good and faulty circuits. This is oftentimes a difficult task, since the effect of a fault may increase the number of unstable states thereby requiring a longer cycle length.

Figure 4C:
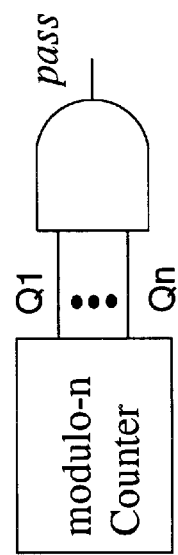
FIG. 4c is a schematic of a possible implementation for an input/flow signal flow generator.
Figure 4B:
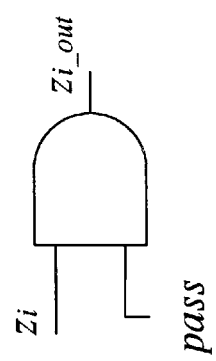
FIG. 4b is a schematic of a possible implementation for an output logic block.
Figure 4A:
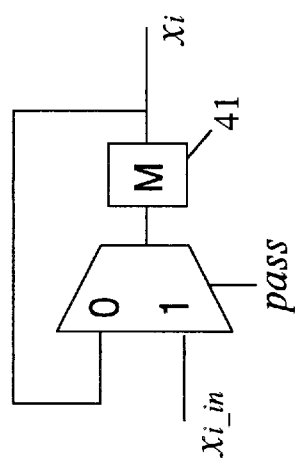
FIG. 4a is a schematic of a possible implementation for an input logic block.

A preferred embodiment of the input logic block 32 is shown in FIG. 4(a), wherein flip-flop 41 is clocked at SYN_PERIOD, previously defined. A signal pass, from IOFG 36, is used to determine when the circuit can accept a new input pattern. When pass is in a low state, signal xi maintains a previous value. Conversely, when pass goes to a high state, the signal xi takes as its value a new value from input line xi_in Similarly, a preferred embodiment of output logic block 34 is shown in FIG. 4(b). As shown in FIG. 4(b), when pass is in a high state, zi_out =zi, otherwise, zi_out remains at an unchanged state.

FIG. 4(c) shows a preferred embodiment of IOFG 36, implemented with a modulo-n counter 44. The main purpose of the IOFG is to generate the signal pass, which as discussed previously, holds the previous input value until the cycling is completed. If the longest distance between two stable states requires cycling through n unstable states, then IOFG 36 may be implemented by using the modulo-n counter 44 as shown in FIG. 4. Since pass is asserted once every n cycles, if a sufficiently large value of n is assumed, then pass will be activated only when the circuit state is stable. As such, an input pattern application and an output pattern observation will occur only when the circuit is in a stable state.

Figure 5A:
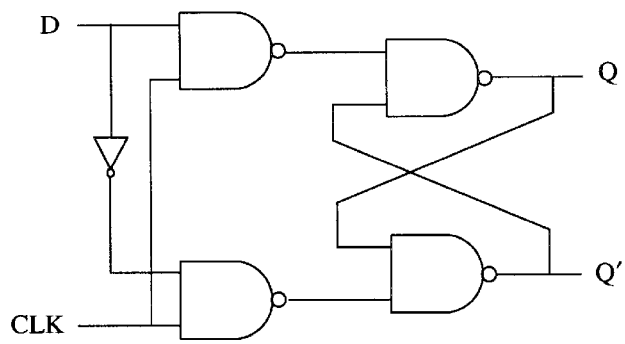
FIG. 5a is a schematic of an asynchronous circuit that is being tested according to the teachings of the present invention.
Figure 5B:
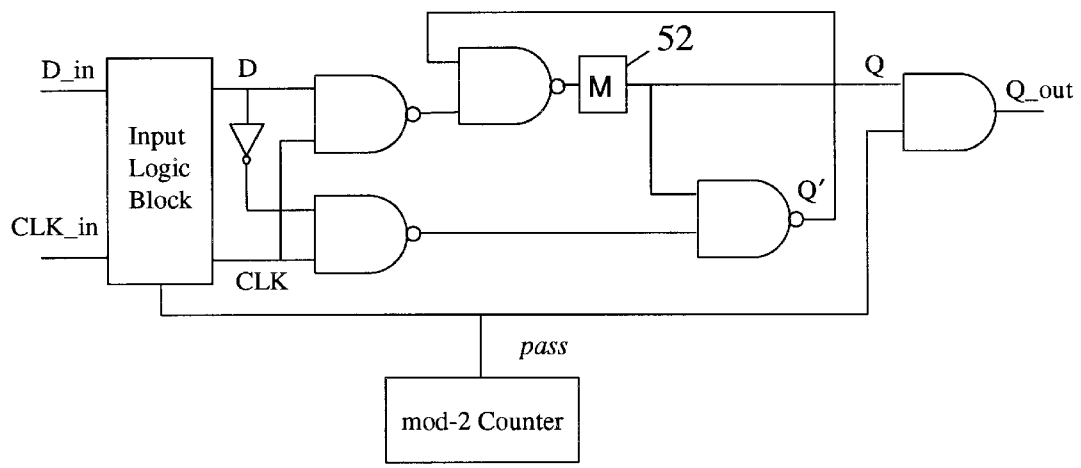

By way of example, consider an asynchronous circuit and an STM as shown in FIGS. 5(a) and 5(b), respectively. Signals D_in and CLK_in are primary inputs of the STM and Q_out is a primary output. As shown in FIG. 5(b), a feedback loop is broken and a clocked flip-flop 52, is introduced as shown. Furthermore, since this circuit requires only two cycles to stabilize, the IOFG may be implemented using modulo-2 counter 54 as shown. In such an implementation, the signal pass is asserted once every two clock cycles.

Once an STM has been constructed for a given asynchronous circuit, a synchronous test generator, many of which are known in the art, may be used to generate tests of the STM. Since the combinational logic of the asynchronous circuit is also included in the STM, there is a one-to-one correspondence between faults in the asynchronous circuit and the STM. Only those faults that correspond to the ones in the asynchronous circuit are targeted. Any faults contained in the ILB, the OLB, or the IOFG need not be considered, as they are part of the model and not part of the real circuit.

Tests for targeted faults in the STM can be generated using a synchronous sequential circuit test generator, which are also known in the art. These generated tests are then translated into sequences for the asynchronous circuit. For example, consider fault Q s-a-0 in the asynchronous circuit shown in FIG. 5(a). The STM shown in FIG. 5(b) can be used to generate a test for this fault and a test sequence that detects this fault is shown in FIG. 6(a). This test sequence which detects the fault for this asynchronous circuit is obtained from the STM test by extracting every vector for which pass=1. The translated test of which is shown in FIG. 6(b).

Figure 7:
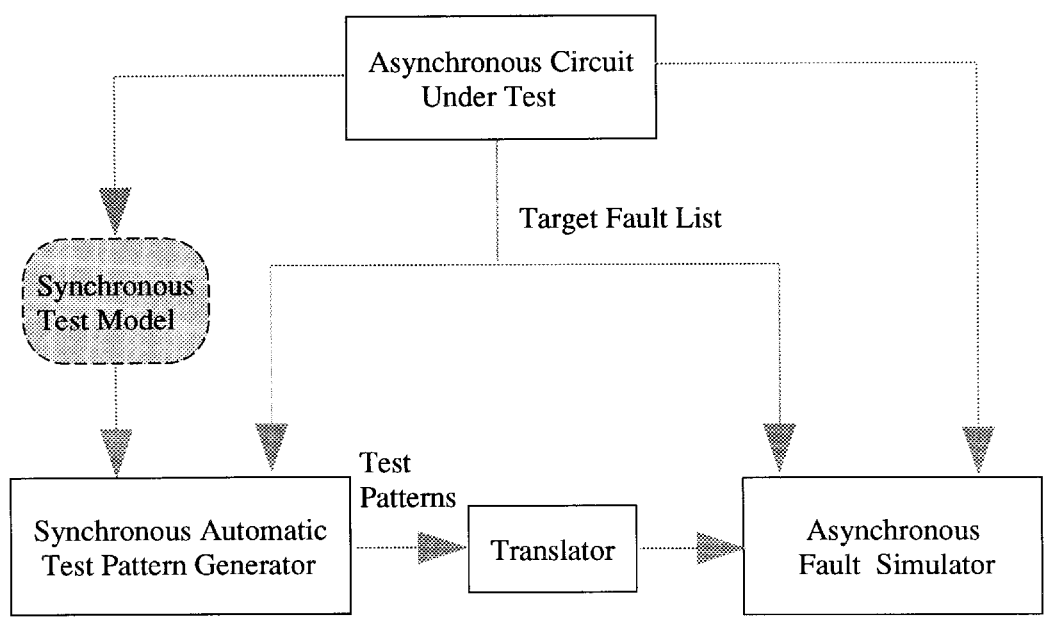
FIG. 7 is a block diagram showing a framework for testing asynchronous circuits using a synchronous test model according to the teachings of the present invention.

FIG. 7 provides an overview of the ATG procedure. For a given asynchronous circuit under test (ACUT), the following steps are preferably performed in order to generate the test sequences:

[1] Construct an STM for the ACUT assuming either a user-specified cycle length or an estimated one;

[2] Generate a target fault list that contains only faults in the ACUT;

[3] Generate a set of test patterns of the STM using a synchronous test generator;

[4] Translate the test patterns into sequences for the ACUT; and

[5] Validate the translated patterns on the ACUT by fault simulation.

It must be noted that the steps required to construct the STM, generate the fault list, and translate the test patterns are found to be computationally inexpensive. Thus, the performance of this procedure is determined by the adopted synchronous circuit ATG and fault simulator.

A test generator using the STM of the present application will not generate a test that requires fault-effect observation in an unstable state of the circuit. Because of explicit restrictions imposed on the STM, (i.e., a new input pattern is only applied when the circuit has stabilized; a fault effect is only propagated to the primary output when the circuit is stable), it is assured that the circuit response is never observed in an unstable state. As a result, test invalidation due to the use of unstable states will not occur for a test derived using the STM.

Knowledge of the cycle-length is required for construction of the STM for an ACUT. Given the structural description of an ACUT, determination of the cycle-length is computationally intensive and becomes complicated when a faulty circuit is considered. Hence, an iterative simulation-based approach is used to determine cycle-length.

In the present implementation of the ATG procedure, a worst-case cycle length is assumed. Since this is somewhat inefficient if an average-case cycle-length is significantly lower than that of the worst-case, a multi-pass testing strategy is preferred thereby improving test time. In a first pass of the multi-pass test, a cycle length of 2 is assumed and all relevant faults are targeted. After performing test pattern generation and validating the translated patterns via fault simulation, a determination is made which faults were successfully detected in the first pass without invalidation. These successfully-detected faults are removed from the fault-list and the STM is constructed by incrementing the cycle-length by one. The test pattern generation, test pattern validation, fault-list modification and cycle-length increment is repeated for each pass. When no more tests are invalidated due to unstable states, then the procedure is complete and the process terminates.

In order to evaluate the effectiveness of the method of the present application, two different sets of experiments were performed on circuits obtained using a synthesis procedure described in the literature. (See., e.g., S. Banerjee, R. K. Roy, S. T. Chakradhar, and D. K. Pradhan, "Initialization Issues in the Synthesis of Asynchronous Circuits", *International Conference on Computer Design*, pp. 447–452, October 1994; and S. T. Chalradhar, S. Banerjee, R. K. Roy, and D. K. Pradhan, "Synthesis of Initializable Asynchronous Circuits", *Proceedings, 7th International Conference on VLSI Design*, pp. 383–388, January 1993). Specifically, and using a model as shown in FIG. 2, the first experiment was designed to verify that unstable states are, in fact, a major source of test invalidation. Since this model assumes that all states are stable, a test may be generated which places the model in an unstable state. The results of the first experiment are summarized in Table 1. It is informative to note that there is a substantial amount of test invalidation, which reflects in lower fault coverage. Furthermore, in some circumstances there was no test invalidation, implying that no test placed the circuit in an unstable state, even though the model of FIG. 2 makes no provision to ensure that this will always be the case.

TABLE 1

| Test Invalidation Using Simple Test Model | |
|---|---|
| Circuit Name | Test Invalidation |
| asm | 14.7 |
| alloc-outbound | 0.0 |
| converta | 13.1 |
| full | 17.5 |
| half | 12.8 |
| nak-pa | 8.8 |
| nowick | 0.0 |
| qr42 | 0.0 |
| ram-read-sbuf | 4.4 |
| rcv-setup | 0.0 |
| sbuf-read-ctl | 4.3 |
| sbut-send-ctl | 17.9 |
| trigger | 13.8 |

In the second experiment, a set of benchmark circuits were used to evaluate both the effectiveness of our testing methodology as well as the accuracy of the model. All tests were validated on an asynchronous circuit using fault simulation as shown in Table 2. One can immediately note by inspecting Table 2 that there is no test invalidation when tests are generated using our model. In sharp contrast, a significant amount of test invalidation was present when a simplistic model was used. In each benchmark circuit considered, a cycle length of five was sufficient.

TABLE 4

Test Results for Embedded Circuits

| Circuit Name | Faults Total | Detected | Untestable | % Test Invalid | % Test Cov. | CPU (Sec.) |
|---|---|---|---|---|---|---|
| asm | 68 | 59 | 9 | 0 | 86.76 | 1.4 |
| alloc-outbound | 98 | 98 | 0 | 0 | 100 | 0.9 |
| converta | 134 | 113 | 21 | 0 | 84.32 | 5.5 |
| full | 86 | 79 | 7 | 0 | 91.86 | 3.2 |
| half | 78 | 69 | 9 | 0 | 88.46 | 2.0 |
| nak-pa | 170 | 163 | 7 | 0 | 95.88 | 7.3 |
| nowick | 104 | 104 | 0 | 0 | 100 | 0.6 |
| qr42 | 118 | 108 | 10 | 0 | 91.52 | 2.8 |
| ram-read-sbuf | 136 | 135 | 1 | 0 | 99.3 | 1.26 |
| rcv-setup | 50 | 49 | 1 | 0 | 98.0 | 0.8 |
| sbuf-read-ctl | 140 | 138 | 2 | 0 | 98.6 | 2.61 |
| sbuf-send-ctl | 138 | 127 | 11 | 0 | 92.0 | 2.26 |
| trigger | 94 | 85 | 9 | 9 | 90.42 | 2.2 |

The invention can be further understood through the following examples in which the asynchronous circuits are part of a larger synchronous system.

1. Embedded Asynchronous Systems

Asynchronous circuits are oftentimes used as an interface between two or more synchronous circuits. As such, even a small portion of asynchronous logic, such as a cross-coupled latch, embedded in a larger system of synchronous logic, makes it untestable for a synchronous circuit test generator.

Figure 8:
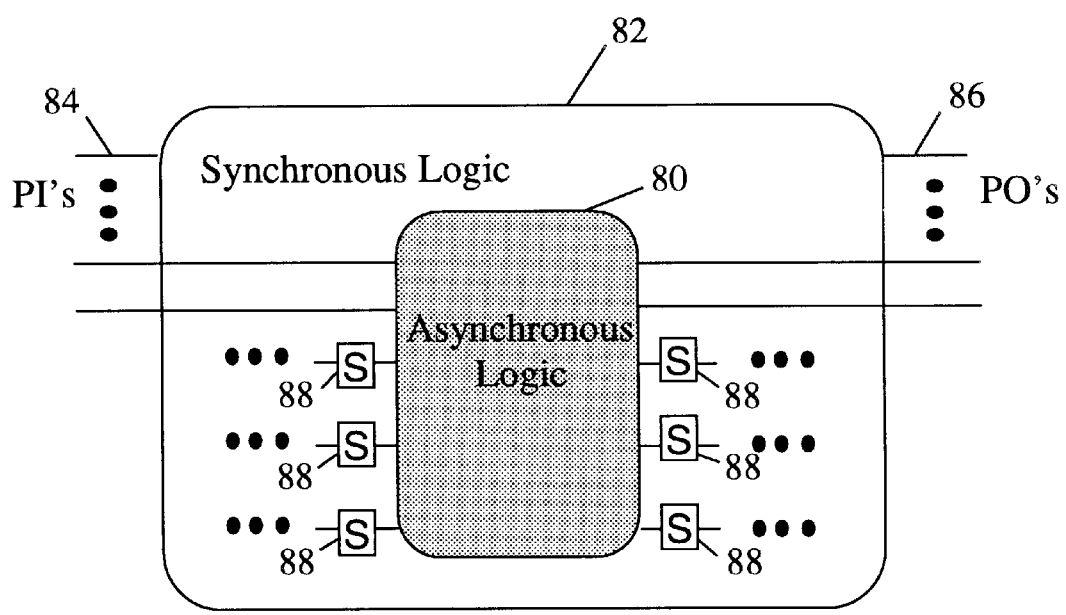
FIG. 8 is a schematic diagram of an embedded asynchronous system.

With reference to FIG. 8, there is shown a schematic diagram of an embedded asynchronous system. Inputs to asynchronous logic block 80 either come directly from primary input lines 84 or from output lines of system flip-flops, 88. These flip-flops are clocked by a system clock (not shown) and for convenience, all flip-flops clocked at the system clock rate are denoted with the letter "S". Those skilled in the art will quickly recognize that such a circuit is not capable of being satisfactorily tested by a known synchronous test method. Nevertheless, and according to the inventive teachings of the present application, if the asynchronous portion of the circuit is replaced by an STM, then a synchronous test generator may be used to test the entire circuit.

Figure 9:
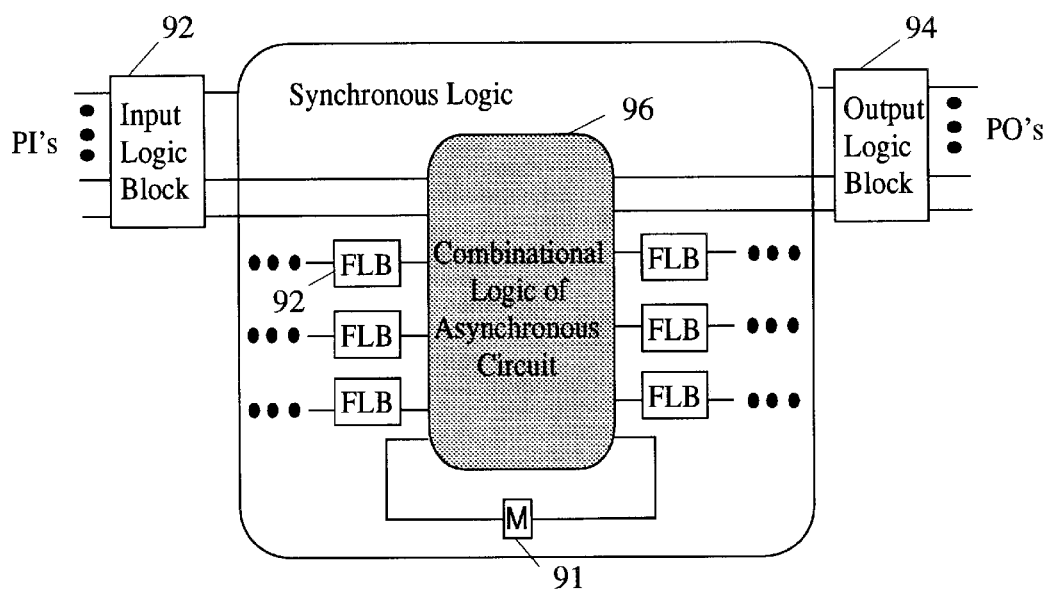
FIG. 9 is a schematic diagram of an STM for the embedded asynchronous system of FIG. 8.

An STM for this embedded system is shown in FIG. 9. A model flip-flop M, 91 corresponds to an asynchronous feedback path. Primary inputs are driven by an input logic block 92, while primary outputs are passed through an output logic block 94, similar to the ones shown in FIG. 4. In order to effectively test this system, an additional restriction must be placed on all system flip-flops, that is the state of the system flip-flops must be maintained while the asynchronous circuit is in an unstable state.

For this purpose of maintaining the system flip-flops, a flip-flop input logic block (FLB) 92, is used which permits the use of a single clock, running at SYN_PERIOD, to operate the entire circuit. As such, this model allows the use of ATGs that can handle only single clocks.

If an ATG is available that can handle two clocks, however, then a simpler model can be used. For such a model, it is assumed that the ATG is capable of restricting input changes to occur in synchrony with one of the clocks. It is also assumed the existence of a strobe signal which determines when output observation can occur.

When using such an ATG which can handle two clocks, the system flip-flops need not be replaced by flip-flop input logic blocks, rather, the system flip-flops are driven by a system clock, and the model flip-flops are driven by a model clock. If a cycle length of an asynchronous circuit is n, then the system clock is exactly n time slower than the model clock. Cycling is permitted by clocking all model flip-flops by model clock. New inputs are then applied at the rate of the system clock. The strobe signal is also asserted at the rate of the system clock, thereby restricting output observation accordingly.

Figure 10A:
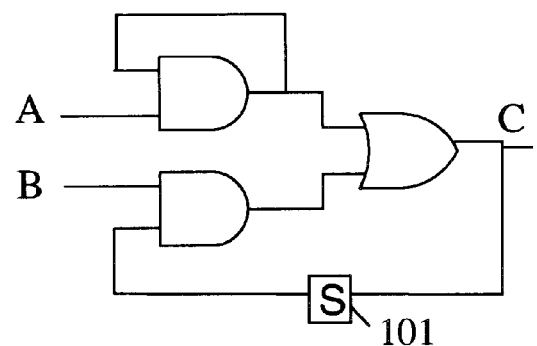
FIG. 10a is an electrical schematic of a simple embedded circuit.
Figure 10B:
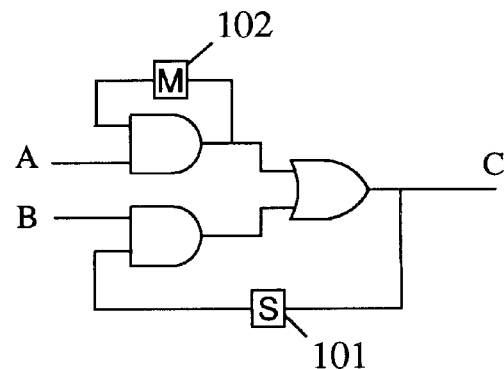
Figure 10C:
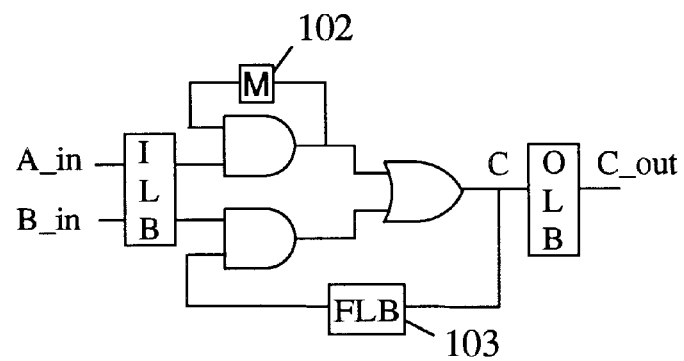

By way of further example, consider the simple embedded circuit shown in FIG. 10(a). The STM for this circuit using two clocks is shown in FIG. 10(b), and an STM for this circuit using a single clock is shown in FIG. 10(c). As with previous examples, flip-flops designated "S" 101 are driven by system clock and flip-flops designated "M" 102 are clocked by the model clock. Additionally, in those situations that require a single clock, i.e., FIG. 10(c), the system flip-flop is replaced by flip-flop input logic block, 103.

To evaluate how well the model can be applied to test embedded systems, some circuits were selected from a known, sequential circuit benchmark suite that are not able to be tested directly by known synchronous test methods. The circuits were modified by replacing a number of flip-flops with an equivalent gate-level representation. Since the internal structure of a flip-flop is inherently asynchronous, a set of embedded circuits suitable for test are therefore provided.

It must be noted that faults within memory elements are generally not targeted by synchronous sequential test generators. Typically, such synchronous sequential test generators only derive tests for faults on any input and any output line(s) of flip-flops contained within a circuit. To demonstrate the deficiency of such an approach, a simple experiment was performed in which tests for faults on input and output lines of a flip-flop were derived using conventional synchronous methods. These tests were then fault simulated on the gate-level representation of the flip-flop shown in FIG. 5(a). Subsequently, the STM shown in FIG. 5(b) was used to derive tests for all faults of the flip-flop. The tests were then translated and validated on the circuit shown in FIG. 5(a). The results of this experiment are shown in Table 3.

TABLE 3

Faults in a D Flip-Flop

| Circuit | Faults Total | Detected | Undetected | % Fault Coverage |
|---|---|---|---|---|
| Synchronous | 28 | 19 | 9 | 67.85 |
| Asynchronous | 28 | 23 | 5 | 82.14 |

Here, the total faults represent a number of possible faults in the circuit of FIG. 5(a). By inspection, one can see that the results show that four faults are not captured by performing a regular synchronous test generation. For a design with several flip-flops, this can represent a large fraction of all faults.

In order to demonstrate how embedded circuits can be tested by the method of the present application, another experiment was performed. For this experiment, a number of known, (ISCAS89) sequential circuit benchmarks were used wherein approximately 25% of flip-flops contained within the circuits were replaced with gate-level representations of same. (See FIG. 5b). An STM for each of these circuits was constructed and described testing methodology was used to derive the tests. The results are summarized in Table 4.

TABLE 4

Test Results for Embedded Circuits

| Circuit Name | # FF | # FF Expand | Faults Total | De- tected | Un- testable | % Fault Cov. | % Test Eff. | CPU (Min.) |
|---|---|---|---|---|---|---|---|---|
| s208  | 8  | 2 | 628  | 395  | 228 | 62.9 | 99.2 | 14.0 |
| s298  | 14 | 3 | 894  | 601  | 195 | 67.2 | 89.0 | 60.7 |
| s344  | 15 | 4 | 1060 | 946  | 68  | 89.3 | 95.7 | 23.5 |
| s349  | 15 | 4 | 1070 | 930  | 73  | 86.9 | 93.7 | 33.4 |
| s386  | 6  | 2 | 1104 | 826  | 273 | 74.8 | 99.5 | 10.7 |
| s420  | 16 | 4 | 1272 | 636  | 628 | 50.0 | 99.4 | 8.0  |
| s641  | 19 | 5 | 2090 | 1765 | 295 | 84.5 | 98.6 | 17.8 |
| s713  | 19 | 5 | 2614 | 2069 | 440 | 79.2 | 96.0 | 60.7 |
| s820  | 5  | 1 | 2150 | 2007 | 130 | 93.4 | 99.4 | 60.1 |
| s832  | 5  | 1 | 2170 | 2005 | 150 | 92.4 | 99.3 | 60.7 |
| s1238 | 18 | 5 | 3346 | 3071 | 271 | 91.8 | 99.9 | 8.0  |

Here, the number of flip-flops in the circuit is given in the second column (# FF) and the number of flip-flops replaced with the gated-level representation are is given in the third column (# FF Expand). The test efficiency, fault coverage obtained after validation and CPU times for each circuit is also tabulated. From these results, one can observe that our method obtains high fault coverage with no test invalidation in reasonable computation time.

2. Gated-Clock Circuits

A common practice among aggressive VLSI designers is to replace portions of synchronous circuitry with functionally equivalent asynchronous circuits. This is primarily done in power critical applications where certain portions of a large circuit are switched off when they are not being used. Oftentimes, this is accomplished by conditionally clocking (deactivating) memory elements.

The selective deactivation of a clock is known as clock gating (See, e.g., A. Mukherjee, *Introduction to nMOS and CMOS VLSI Systems Design*, Prentice-Hall, 1986; K. Wagner, "Clock System Design", *IEEE Design and Test of Computers*, pp. 9–27, October 1988; and L. Benini, P. Siegel and G. DeMicheli, "Saving Power by Synthesizing Gated Clocks for Sequential Circuits", *IEEE Design & Test of Computers*, pp. 32–41, Winter 1994) and circuits in which this technique is used are known as gated-clock circuits. Gated-clock circuits are most often found in custom VLSI systems, such as microprocessors and are perhaps the most widely used asynchronous circuits in industrial design.

As with embedded asynchronous systems, conventional synchronous test generators are unable to test circuits having gated-clocks. Nevertheless, by replacing all flip-flops having a gated-clock by their equivalent gate-level representation (See FIG. 5(b)), gated-clock circuits can be treated as embedded circuits which can then be tested using the method of the present application.

3. Realistic Physical Fault Modeling

Those skilled in the art will recognize that in the presence of a fault, even well-behaved combinational and synchronous sequential circuits may become asynchronous. An example of this behavior is a feedback bridging fault as described by M. Abramovici, M. Breuer and A. Friedman in *Digital Systems Testing and Testable Design*, Computer Science Press, 1990. A commonly adopted method for generating tests for such faults is to detect a change in functionality as a result of the bridge. This requires that there will be at least one input pattern that will cause different outputs for good and faulty circuits.

To detect this using an automatic test generation model, two copies of the circuit are obtained. The first copy corresponds to the good circuit and the second copy corresponds to the faulty circuit. A set of the same input patterns are applied to both the good and faulty circuits and a feedback bridging fault is introduced in the faulty copy. The output lines of the two circuits are XOR'ed (wired-OR model). A test for the output line s-a-0 will therefore detect the bridging fault. Since the resulting ATG model is asynchronous it is possible therefore to apply STM testing methodology and derive a test for the required fault.

4. Feedback Bridging Faults in Combinational Circuits

A feedback bridging fault of a combinational circuit described by F. J Ferguson in an article entitled "Physical Design for Testability for Bridges in CMOS Circuits" which appeared in *IEEE VLSI Test Symposium*, pp. 290–295, 1993, is shown in FIG. 11(a). A bridge 110, is designated by a dotted line from line H to line D. An ATG model for this combinational circuit is shown in FIG. 11(b). An upper half of the circuit 112 represents a faulty circuit while a lower half 114 represents a fault-free circuit. Output lines 116 and 118 from each of the two circuits are routed to XOR gate 119, as shown.

As previously discussed, a test for out s-a-0 will detect the bridging fault Since the ATG model for the fault is an asynchronous circuit, however, it too cannot be tested directly by known synchronous methods. Nevertheless, this circuit can be modeled and tested according to our teachings using an STM.

To perform this test, a flip-flop is inserted in the feedback loop. Restrictions on input pattern application and output observation are enforced as described previously. A test sequence is then derived for this fault and subsequently translated. The translated sequence is then validated on an ATG model shown in FIG. 11(b). The translated sequence for this example is shown in FIG. 11(c).

To further evaluate the effectiveness of the method of the present application on combinational circuits, five likely feedback bridging faults were introduced into known (ISCAS85) combinational circuit benchmarks and then tested accordingly. The results of these tests are summarized in Table 5. For each of the circuits, valid tests were generated for all of the injected faults.

TABLE 5

Testing for Feedback Bridging Faults in ISCAS85 Benchmarks

| | | Faults | |
|---|---|---|---|
| Circuit | Gates | Injected | Detected |
| c1355 | 474  | 5 | 5 |
| c1908 | 441  | 5 | 5 |
| c2670 | 675  | 5 | 5 |
| c3540 | 953  | 5 | 5 |
| c432  | 120  | 5 | 5 |
| c499  | 162  | 5 | 5 |
| c5315 | 1413 | 5 | 5 |
| c6288 | 2384 | 5 | 5 |
| c880  | 294  | 5 | 5 |

5. Feedback Bridging Faults in Synchronous Sequential Circuits

A feedback bridging fault in a synchronous sequential circuit can make the circuit asynchronous. A simple example of such a fault is shown in FIG. 12(a). As in the combinational case above, an ATG model for the fault may be constructed as shown in FIG. 12(b). This resulting model can be treated as an embedded circuit and can be therefore tested accordingly. A final, validated test sequence for this bridging fault is shown in FIG. 12(c). Once again, to demonstrate the effectiveness of the method of the present application, a number of known (ISCAS89) benchmark circuits were evaluated. The results of this evaluation are summarized in Table 6. The results show that valid tests were generated for all injected faults.

TABLE 6

Testing for Feedback Bridging Faults in ISCAS89 Benchmarks

| Circuit | Gates | FFs | Faults Injected | Detected |
|---|---|---|---|---|
| s208 | 61 | 8 | 5 | 5 |
| s298 | 75 | 14 | 5 | 5 |
| s344 | 101 | 15 | 5 | 5 |
| s349 | 104 | 15 | 5 | 5 |
| s386 | 118 | 6 | 5 | 5 |
| s420 | 122 | 16 | 5 | 5 |
| s641 | 107 | 19 | 5 | 5 |
| s713 | 139 | 19 | 5 | 5 |
| s820 | 256 | 5 | 5 | 5 |
| s832 | 262 | 5 | 5 | 5 |
| s1238 | 428 | 18 | 5 | 5 |

While the invention has been shown and described in detail in the context of a preferred embodiment, it will be apparent to those skilled in the art that variations and modifications are possible without departing from the broad principles and spirit of the invention which should be limited solely by the scope of the claims appended hereto.

What is claimed is:

1. A method for testing an asynchronous circuit comprising the steps of:

constructing a Synchronous Test Model for the asynchronous circuit wherein said asynchronous circuit does not have a pre-specified clock by constructing an input logic block for the asynchronous circuit, by constructing an output logic block for the asynchronous circuit, and by constructing an input/output signal flow generator for the asynchronous circuit;

generating a test for the Synchronous Test Model;

translating, without requiring any modification of the asynchronous circuit, a set of patterns for the Synchronous Test Model to the asynchronous circuit;

creating a target fault list that contains only faults in the asynchronous circuit; and validating the translated patterns by fault simulation on the asynchronous circuit;

where said input logic block includes:

a multiplexer having first and second inputs, a control input and an output; and a flip-flop having an input connected to the multiplexer output and an output connected to said first multiplexer input such that when a new input signal is applied to the second input a signal present at the output remains the same or becomes a value of the new input signal depending upon the application of a signal to the control input.

2. A method for testing an asynchronous circuit comprising the steps of:

constructing a Synchronous Test Model for the asynchronous circuit wherein said asynchronous circuit does not have a pre-specified clock by constructing an input logic block for the asynchronous circuit, by constructing an output logic block for the asynchronous circuit, and by constructing an input/output signal flow generator for the asynchronous circuit;

generating a test for the Synchronous Test Model;

translating, without requiring any modification of the asynchronous circuit, a set of patterns for the Synchronous Test Model to the asynchronous circuit;

creating a target fault list that contains only faults in the asynchronous circuit; and validating the translated patterns by fault simulation on the asynchronous circuit;

where said output logic block includes:

an AND gate having two inputs and a single output such that when one of the inputs is at a predetermined high level, and the other input is at a particular low level, the output is at a level equal to the particular low level of the other input, otherwise the output remains unchanged.

3. A method for testing an asynchronous circuit comprising the steps of:

constructing a Synchronous Test Model for the asynchronous circuit wherein said asynchronous circuit does not have a pre-specified clock by, constructing an input logic block for the asynchronous circuit, by constructing an output logic block for the asynchronous circuit, and by constructing an input/output signal flow generator for the asynchronous circuit;

generating a test for the Synchronous Test Model;

translating, without requiring any modification of the asynchronous circuit, a set of patterns for the Synchronous Test Model to the asynchronous circuit;

creating a target fault list that contains only faults in the asynchronous circuit; and validating the translated patterns by fault simulation on the asynchronous circuit, where said input/output signal flow generator includes:

an AND gate having a plurality of inputs and an output; and a modulo-n counter having a plurality of outputs, wherein each one of said outputs is connected to a respective one of said AND inputs such that said modulo-n counter outputs are all at a predetermined high level once every n cycles and said AND output is at the predetermined high level once every n cycles.

4. The method according to claim 3 wherein the output of said AND gate is a control signal.

* * * * *